(12) United States Patent
Hadjichristos et al.

(10) Patent No.: US 8,385,854 B2
(45) Date of Patent: Feb. 26, 2013

(54) ADAPTIVE PARAMETRIC POWER AMPLIFIER PROTECTION CIRCUIT

(75) Inventors: Aristotele Hadjichristos, San Diego, CA (US); Gurkanwal S. Sahota, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 435 days.

(21) Appl. No.: 12/470,418

(22) Filed: May 21, 2009

(65) Prior Publication Data
US 2011/0095826 A1    Apr. 28, 2011

(51) Int. Cl.
*H01Q 11/12*       (2006.01)
*H04B 1/04*        (2006.01)
*H03G 3/10*        (2006.01)

(52) U.S. Cl. .............. 455/117; 455/127.2; 330/279; 330/289; 330/298

(58) Field of Classification Search ............... 455/115.1, 455/115.3, 117, 127.1, 127.2, 127.3, 67.11; 330/129, 207 P, 278, 285, 289, 298, 279
See application file for complete search history.

(56) References Cited

U.S. PATENT DOCUMENTS

| | | | |
|---|---|---|---|
| 6,580,318 B2 * | 6/2003 | Taylor | 330/129 |
| 7,030,700 B2 * | 4/2006 | Wong et al. | 330/298 |
| 7,088,971 B2 * | 8/2006 | Burgener et al. | 455/127.1 |
| 7,782,135 B2 * | 8/2010 | Berkhout | 330/251 |
| 2002/0125945 A1 | 9/2002 | Taylor | |
| 2008/0297260 A1 | 12/2008 | Makihara et al. | |

FOREIGN PATENT DOCUMENTS

WO    WO2004013957    2/2004

OTHER PUBLICATIONS

International Search Report and Written Opinion—PCT/US2010/035863, International Search Authority—European Patent Office—Oct. 5, 2010.

* cited by examiner

*Primary Examiner* — Quochien B Vuong
(74) *Attorney, Agent, or Firm* — Ramin Mobarhan

(57) ABSTRACT

A device including a gain control element coupled prior to or within a radio frequency (RF) power amplifier (PA) with an adaptive parametric PA protection circuit is described. In an exemplary embodiment, the device includes a gain control element coupled prior to a radio frequency power amplifier with a power stage with corresponding transistor breakdown threshold values, having an adaptive parametric PA protection circuit configured to receive at least one power stage drain-source voltage parameter value, at least one power stage drain-gate voltage parameter value, and at least one power stage drain-source current parameter value, and including an adaptive parametric PA protection circuit having a first section for processing the parameter values and a second section for generating a gain correction signal to adjust the gain control element with optimal power added efficiency (PAE) for the power stage within the corresponding transistor breakdown threshold values.

30 Claims, 5 Drawing Sheets

ADAPTIVE PARAMETRIC POWER AMPLIFIER PROTECTION CIRCUIT

TECHNICAL FIELD

The present disclosure relates generally to electronics, and more specifically to an adaptive parametric power amplifier protection circuit.

BACKGROUND

In communication devices designed to transmit signals, such as cellular devices, power amplifier circuits are typically used to amplify a desired signal to allow proper transmission. Power amplifier circuits may, for example, be implemented in Complimentary Metal Oxide Semiconductor (CMOS) technology or Bipolar Junction Transistor (BJT) technology. The power amplifier circuits may, for example, comprise of two or more cascaded gain stages, a driver stage and a power stage. The power stage may include CMOS or BJT transistors. Both CMOS and BJT transistors have breakdown voltages, which if exceeded may result in damage to the transistor. Breakdown voltage is a maximum voltage, which when be applied across any two terminals of a transistor may cause transistor damage. For example, there is a maximum voltage, which can be applied across the drain and source terminal of the CMOS transistor, or the collector and emitter terminal of the BJT transistor. When the breakdown voltage is exceeded an avalanche current may be created in the transistor, which results in a large current flowing through the transistor and thus a significant increase in heat that may damage the transistor and degrade transistor performance. Transistor breakdown can also occur if the maximum safe operating voltage across any other pair of transistor terminals, such as the gate to drain voltage or gate to source voltage. If the gate to drain voltage or gate to source voltage exceeds the respective breakdown voltage, gate oxide breakdown way occur. Oxide breakdown is when conduction path is created from the anode to the cathode through the gate oxide layer of the transistor. When the transistors utilized in the power amplifier circuit are damaged, the transistors may operate in an unpredictable manner or cease to operate at all. Thus, power amplifier circuit reliability is severely compromised by transistor breakdown voltage occurrence in the power stage. Therefore, when designing transistor circuits it is of paramount importance to design the circuit such that the voltage across the terminals of the transistor does not exceed the transistor's breakdown voltage.

However, to maximize power amplifier circuit efficiency the output of the power amplifier circuit needs to be capable of creating an output voltage swing from the negative voltage supply value up to the positive voltage supply value. In many embodiments, for example, the output voltage swing may be greater than twice the battery voltage. For example, if the device battery has a voltage level of 4.2 volts, the power amplifier circuit would need to be capable of creating an output voltage swing of 8.4 volts or more. However, a typical transistor, for example, may only be able to withstand up to 3 volts across its terminals before it reaches the breakdown region. To alleviate the voltage applied across the terminals of the power amplifier circuit transistors, multiple transistors may be coupled in a cascode configuration. The cascode configuration, for example, may comprise three transistors coupled in a cascode configuration thus reducing the voltage applied across each transistor. While this may prevent each transistor from reaching the breakdown voltage, the drain to gate voltage of the top transistor may cause damage when the output voltage is peaked. Further, if the output of the power amplifier circuit is attached to an antenna, a variation to the Voltage Standing Wave Ratio (VSWR) of the antenna may cause the output voltage of the power amplifier circuit increase to a even greater voltage level. Lastly, the voltage provided by the device battery may vary, for example, from 3.2 volts to 4.2 volts.

Therefore, there is a need for a power amplifier circuit design, which provides full output voltage swing capability and thus maximum efficiency while protecting the power amplifier circuit transistors from reaching the breakdown voltage.

DETAILED DESCRIPTION

The word "exemplary" is used herein to mean "serving as an example, instance, or illustration." Any embodiment described herein as "exemplary" is not necessarily to be construed as preferred or advantageous over other embodiments.

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

The proposed solution utilizes a RF CMOS PA, with a driver stage and a power stage, which includes an adaptive parametric PA protection circuit receiving $V_{ds3}$ (power stage drain to source voltage value), $V_{dg3}$ (power stage drain to gate voltage value), and $I_{ds}$ (power stage drain to source current value). The PA protection circuit then generates in response a Direct Current (DC) bias current for the driver state to optimize the RF-CMOS PA efficiency without reaching the corresponding CMOS transistor breakdown voltage.

The PA protection circuit may be implemented, for example, as an analog control loop control embedded within the RF-CMOS PA. The adaptive parametric PA protection circuit may be configured with variable digital thresholds for $V_{ds3}$, $V_{dg3}$, and $I_{ds}$ as a function of the RF-CMOS PA operating mode, operating radio frequency, operating temperature, and operating DC voltage. The variable digital thresholds are set with control signals provided by a baseband digital controller or processor. The PA protection circuit may be implemented in digital hardware or software and collect parameters ($V_{ds3}$, $V_{dg3}$, $I_{ds}$, temperature) with analog to digital converters and control the DC bias current of the driver stage with a digital control signal directly. The DC bias current for the driver stage may be controlled by digital hardware or software utilizing a digital to analog converter to generate an analog control signal.

It is noted that even though the following description and corresponding figures describe the use of CMOS transistor circuits, one skilled in the art would clearly understand the principles explained herein could also be applied to BJT transistor circuits to provide the same benefits discussed herein.

Figure 1:
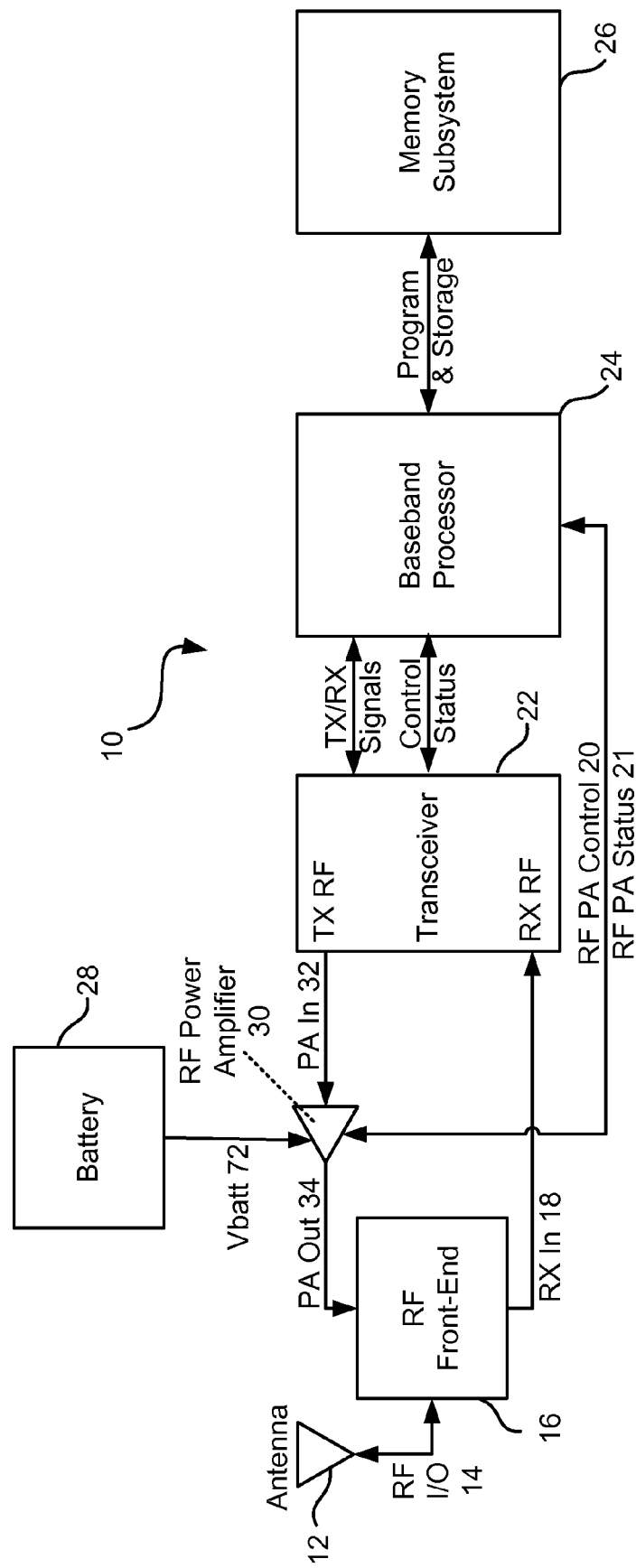
FIG. 1 is a block diagram of a conventional transceiver device capable of transmitting and receiving communication signals.

FIG. 1 is a block diagram of a conventional transceiver device 10 capable of transmitting and receiving communication signals. Antenna 12 is coupled to radio frequency (RF) front-end 16. The signal coupled between antenna 12 and RF front-end 16 is RF I/O 14. The output of RF front-end 16 is coupled to the RX RF input terminal of transceiver 22. The signal coupled between RF front-end 16 and the RX RF input terminal of transceiver 22 is RX In 18. TX/RX Signals and Control Status terminals of transceiver 22 are coupled to baseband processor 24. Program and storage terminal of baseband processor 24 is coupled to the program and storage terminal of memory subsystem 26. Battery 28 is coupled to RF power amplifier 30. The direct current (DC) signal coupled between battery 28 and RF power amplifier 30 is $V_{batt}$ 72. TX RF output terminal of transceiver 22 is coupled to the input terminal of RF power amplifier 30. The signal coupled between the TX RF output terminal of transceiver 22 and the input terminal of RF power amplifier 30 is PA In 32. RF PA control signal 20 and RF PA status signal 21 are coupled between RF power amplifier 30 and baseband processor 24. The output of RF power amplifier 30 is coupled to the RF front-end 16. The signal coupled between the output terminal of RF power amplifier 30 and RF front-end 16 is PA out 34.

When operating in receiving mode, antenna 12 receives an input signal, which is coupled to RF front-end 16. The received signal is then coupled to the RX RF input terminal of transceiver 22. Transceiver 22 then performs RF demodulation of the received signal. The transceiver 22 then sets the control status to receive mode and sends the demodulated baseband RX signal to baseband process 24. The baseband processor 24 then digitally demodulates the baseband RX signal and stores the results in memory subsystem 26.

When operating in transmit mode, baseband processor 24 receives transmit information from memory subsystem 26. The transmit information is then digitally modulated by baseband processor 24. The baseband processor 24 then sets the control status to transmit mode and sends the digitally modulated transmit signal to transceiver 22. Transceiver 22 then performs RF modulation of the transmit signal. The transmit signal is then coupled from the TX RF output terminal of transceiver 22 to the input terminal of RF power amplifier 30. RF power amplifier 30 then amplifies the transmit signal, thus increasing the power level of the transmit signal. The transmit signal is then coupled to the input terminal of the RF Front-End 16. The transmit signal is then coupled to antenna 12. The transmit signal is then radiated in the surrounding space by antenna 12.

Figure 2:
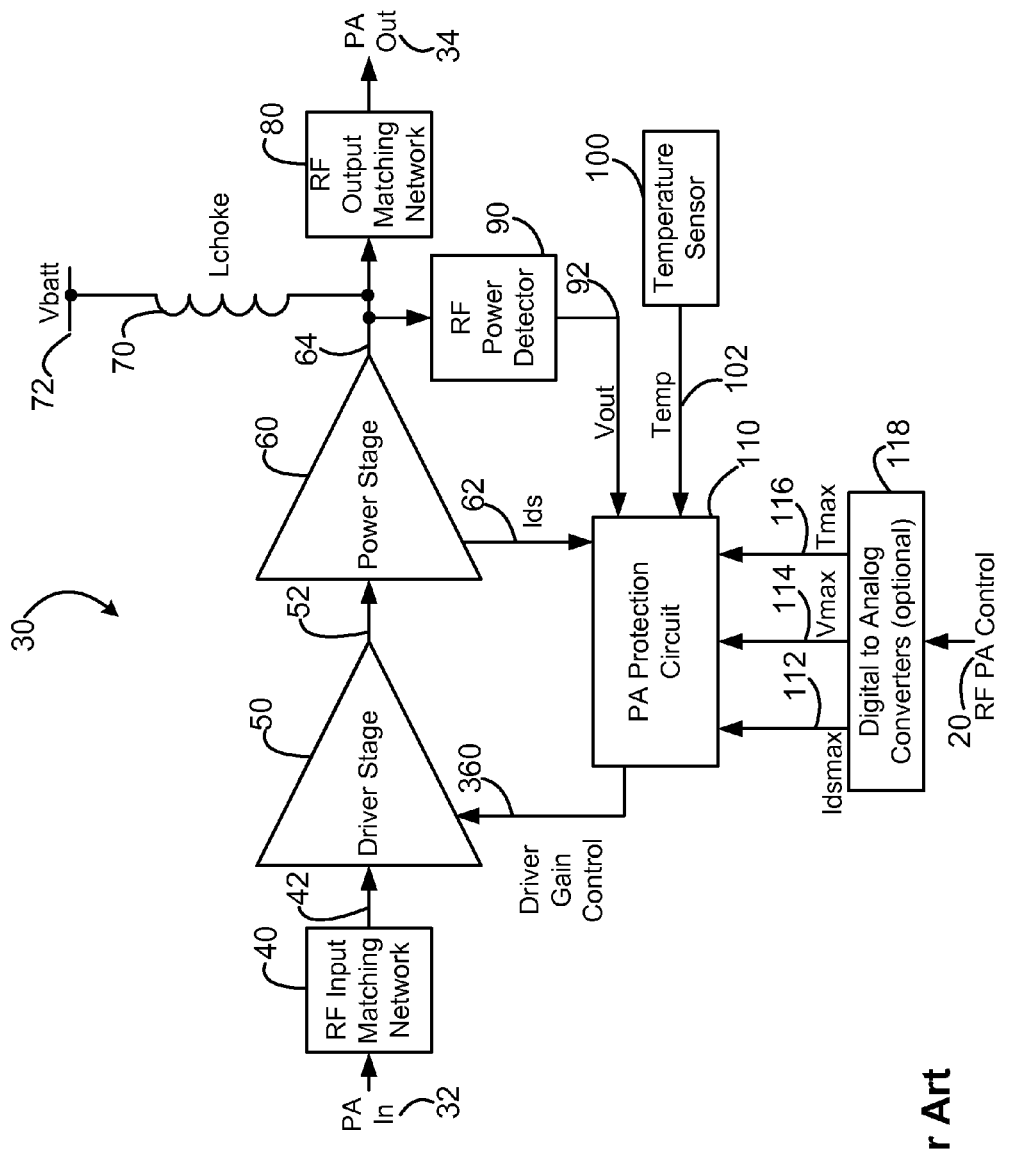
FIG. 2 is a low-level block diagram of the radio frequency (RF) power amplifier device shown in FIG. 1 including a power amplifier protection circuit that monitors the power stage current, output voltage, temperature and power amplifier control signals then adjusts the driver stage gain in accordance with a first exemplary embodiment.

FIG. 2 is a low-level block diagram of the RF power amplifier device 30 shown in FIG. 1, comprising a power amplifier protection circuit 110, which monitors the power stage current 62, output voltage 64, temperature 102 and power amplifier control signals then adjusts the driver stage gain 360 in accordance with a first exemplary embodiment.

Power amplifier input (PA In) signal 32 is coupled to the input terminal of RF input matching network 40. The output of RF input matching network 40 is coupled to a first input terminal of driver stage 50. The output terminal of driver stage 50 is coupled to the input terminal of power stage 60. The output terminal of power stage 60 is coupled to the input terminal of RF output matching network 80, input terminal of RF power detector 90 and a second terminal of inductor 70. A first terminal of inductor 70 is coupled to voltage supply $V_{batt}$ 72. The output terminal of RF output matching network 80 provides power amplifier output signal 34. The output of RF power detector 90 provides output signal $V_{out}$ which is coupled to a first input terminal of PA protection circuit 110. Power stage provides drain to source current value $I_{ds}$ 62 which is coupled to a second input terminal of PA protection circuit 110. The $I_{ds}$ value is amount of current flowing through the transistors coupled in a cascode configuration in power stage 60. Temperature sensor 100 provides output signal Temp which is coupled to a third input terminal of PA protection circuit 110. RF PA control signal 20 is coupled to an input terminal of digital-to-analog converter (DAC) 118. A first, second and third output terminal of DAC 118 is coupled to a fourth, fifth and sixth input terminal, respectively, of PA protection circuit 110. The first output terminal of DAC 118 provides a signal $I_{dsmax}$, which represents the maximum drain to source current allowed to flow through the power stage 60 transistors. The second output terminal of DAC 118 provides signal $V_{max}$, which represents the maximum power stage 60 output voltage allowed. The third output terminal of DAC 118 provides signal T max, which represents the maximum operating temperature allowed. PA protection circuit 110 provides an output driver gain control signal 360 which is coupled to a second input of driver stage 50.

RF input matching network 40 provides maximum transfer of energy from the transceiver block 22. Driver stage 50 provides an amplification of the transmit signal. Power stage 60 provides further amplification of the transmit signal. RF output matching network 80 provides maximum transfer of energy from the power stage 60 to the RF Front-End 16. Inductor 70 provides a choke between the battery voltage source 72 and the power stage 60 output terminal 64. A choke provides a short circuit connection for DC signals while providing an open circuit connection for RF signals, thus only allowing DC signal to flow between the battery voltage source 72 and power stage output terminal 64. RF power detector 90 measures the output power present on power stage output terminal 64 and provides the corresponding voltage value present on power stage output terminal 64. Temperature sensor 100 measures the device temperature and provides a signal 102 corresponding to the temperature measured. A temperature sensor 100 may provide a voltage, current, resistive or digital value, which correlates to the temperature measured.

RF PA control signal 20 provides PA protection circuit 110 with maximum drain to source transistor current level 112, maximum power stage 60 output voltage level 114 and maximum temperature value 116. It is noted that the RF PA control signal 20 may be multiple analog signals coupled to PA protection circuit 110 or may be a digital signal coupled to a DAC 118, which then converts the digital signal to three separate analog signals.

The PA protection circuit 100 then compares the measured inputs with the respective RF PA control inputs. If any of the measured inputs are equal to or greater than the corresponding RF PA control input then the driver stage 50 gain is reduced by adjusting the driver gain control signal 360. If none of the measured inputs are equal to or greater than the corresponding RF PA control input then the driver stage 50 gain is not adjusted.

This first embodiment ensures reliable performance of a power amplifier circuit by monitoring the power stage 60 $I_{ds}$ current 62, output voltage 92 and operating temperature 102 and comparing the monitored values with the RF PA control values to determine the optimum driver stage 50 gain setting.

Figure 3:
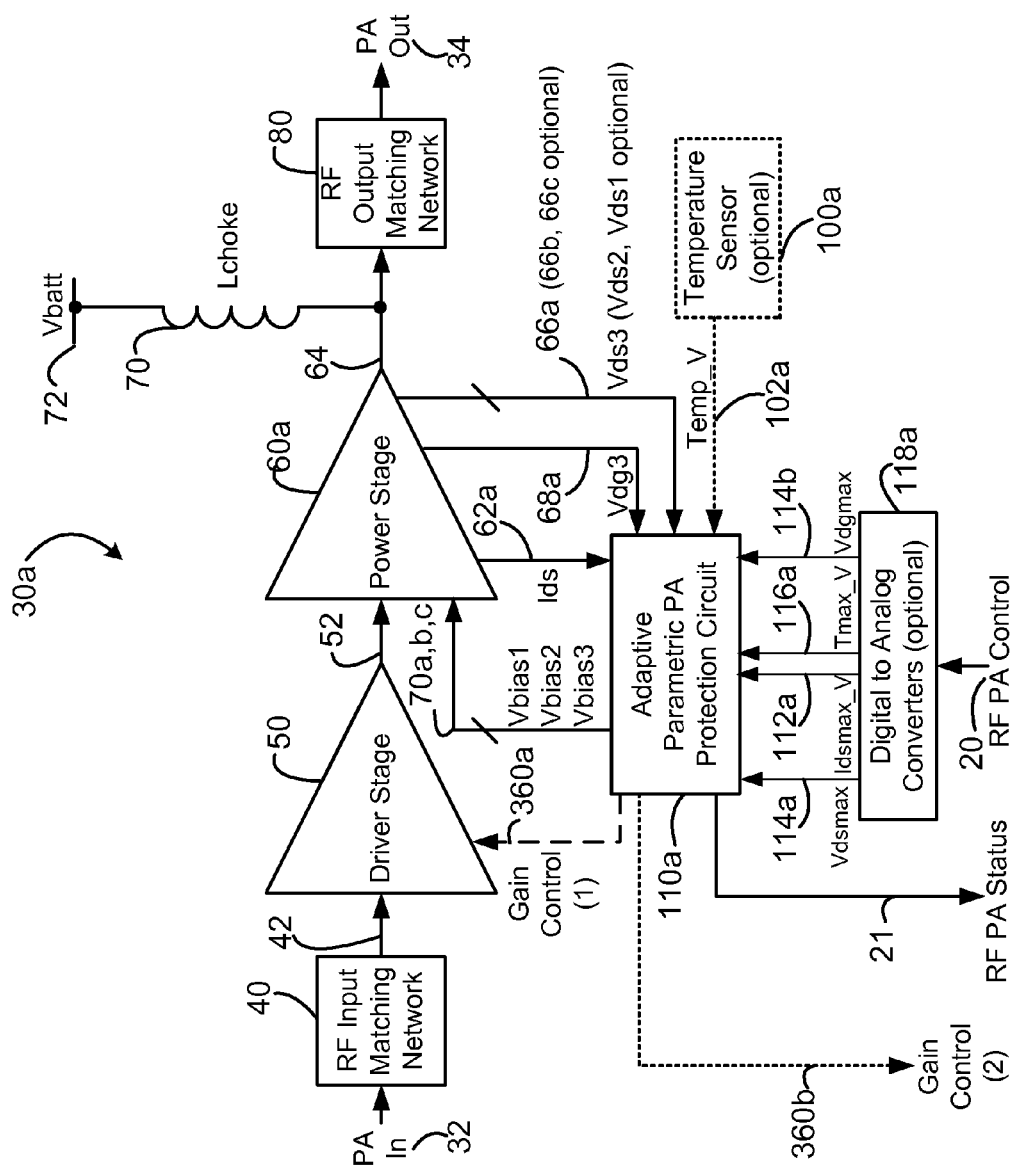
FIG. 3 is a low-level block diagram of the RF power amplifier device 30 shown in FIG. 1 including a power amplifier protection circuit that monitors the power stage current, voltage applied across each power stage transistor, the gate to drain voltage of the top transistor, temperature and power amplifier control signals then adjusts the driver stage gain, the bias voltage applied to each power stage transistor, digital gain control and power amplifier status signal in accordance with a second exemplary embodiment.

FIG. 3 is a low-level block diagram of the RF power amplifier device 30 shown in FIG. 1, comprising an adaptive parametric power amplifier (PA) protection circuit 110a which monitors the power stage current 62, voltage applied across each power stage transistor 66a, 66b, 66c, the gate to drain voltage of the top transistor 68a, temperature 102 and RF power amplifier control signals $V_{dsmax}$ 114a, $I_{dsmax}$ 112a, $T_{max\_V}$ 116a, $V_{dgmax}$ 144b then adjusts the driver stage gain 360a, the bias voltage applied to each power stage transistor 70a, 70b, 70c, digital gain control 360b and power amplifier status signal 21, in accordance with a second exemplary embodiment.

Power amplifier input (PA In) signal 32 is coupled to the input terminal of radio frequency (RF) input matching network 40. The output of RF input matching network 40 is coupled to a first input terminal of driver stage 50. The output terminal of driver stage 50 is coupled to the input terminal of power stage 60a. The output terminal of power stage 60a is coupled to the input terminal of RF output matching network 80 and a second terminal of inductor 70. A first terminal of inductor 70 is coupled to voltage supply $V_{batt}$ 72. The output terminal of RF output matching network 80 provides power amplifier output signal 34. Power stage 60a provides drain to source current value $I_{ds}$ 62, which is coupled to a first input terminal of PA protection circuit 110a. Power stage 60a provides drain to gate transistor voltage $V_{dg3}$ 68a (of the top transistor coupled in cascode configuration), which is coupled to a second input terminal of PA protection circuit 110a. The $I_{ds}$ value is amount of current flowing through the transistors coupled in a cascode configuration in power stage 60a. Power stage 60a provides drain to source voltage Vds3 66a (of the top transistor coupled in cascode configuration), which is coupled to a third input terminal of PA protection circuit 110a. Power stage 60a may also provide drain to source voltages Vds2 66b and Vds1 66c (of the middle and bottom transistors, respectively, coupled in cascode configuration), which may be coupled to a fourth and fifth input terminal, respectively, of PA protection circuit 110a. Temperature sensor 100a provides output signal Temp_V 102a, which is coupled to a sixth input terminal of PA protection circuit 110a. RF PA control signal 20 is coupled to an input terminal of Digital to Analog Converter (DAC) 118. A first, second and third output terminal of DAC 118 is coupled to a seventh, eighth and ninth input terminal, respectively, of PA protection circuit 110. The first output terminal of DAC 118 provides a signal $I_{dsmax}$, which represents the maximum drain to source current allowed to flow through the power stage 60a transistors. The second output terminal of DAC 118 provides signal Vdsmax, which represents the maximum drain to source voltage allowed for the transistors utilized in power stage 60a. The third output terminal of DAC 118 provides signal $V_{dgmax}$, which represents the maximum drain to gate voltage allowed for the top transistor utilized in power stage 60a. The fourth output terminal of DAC 118 provides signal $T_{max}$, which represents the maximum operating temperature allowed. PA protection circuit 110a provides a first output driver gain control signal 360a, which is coupled to a second input of driver stage 50. PA protection circuit 110a provides a second output gain control signal 360b. PA protection circuit 110 provides a third output RF PA status signal.

RF input matching network 40 provides maximum transfer of energy from the transceiver block 22. Driver stage 50 provides a amplification of the transmit signal. Power stage 60a provides further amplification of the transmit signal. RF output matching network 80 provides maximum transfer of energy from the power stage 60a to the RF Front-End 16. Inductor 70 provides a choke between the battery voltage source 72 and the power stage 60a output terminal 64. A choke provides a short circuit connection for DC signals while providing an open circuit connection for RF signals, thus only allowing DC signal to flow between the battery voltage source 72 and power stage output terminal 64. The drain to gate 68a and drain to source voltages 66a/66b/66c are measured by PA protection circuit 110a. Temperature sensor 100 measures the device temperature and provides a signal corresponding to the temperature measured. A temperature sensor may provide a voltage, current, resistive or digital value, which correlates to the temperature measured.

RF PA control signal 20 provides PA protection circuit 110a with maximum drain to source transistor current level 112a, maximum power stage 60a transistor drain to source voltage 114a and drain to gate voltage 114b and maximum temperature value 116a. It is noted that the RF PA control signal may be multiple analog signals coupled to PA protection circuit 110a or may be a digital signal coupled to a DAC 118, which then converts the digital signal to four separate analog signals.

PA protection circuit 110a provides three output signals. PA protection circuit 110a provides a first output gain control signal 360a. The gain control signal 360a adjusts the gain of driver stage 50. PA protection circuit 110a provides a second output gain control signals 360b. The gain control signal 360b can be used to adjust the gain applied in the transceiver block 22 or baseband processing block 24. PA protection circuit 110a provides a third output RF PA status signal 21. The RF PA status signal 21 can be monitored by the baseband processor 24 to calculate adjustments to the RF PA control signal 20 provided to PA protection circuit 110a. The PA protection circuit then compares the measured inputs with the respective RF PA control inputs. If any of the measured inputs are equal to or greater than the corresponding RF PA control input then the driver stage 50 gain is reduced by adjusting the driver gain control signal 360a. If none of the measured inputs are equal to or greater than the corresponding RF PA control input then the driver stage 50 gain is not adjusted.

This second embodiment ensures reliable performance of a power amplifier circuit by monitoring the power stage 60a $I_{ds}$ current 62a, top transistor drain to gate voltage 68a, transistor drain to source voltage 66a/66b/66c and operating temperature 102a and comparing the monitored values with the respective RF PA control values to determine the optimum driver stage 50 gain setting.

Figure 4:
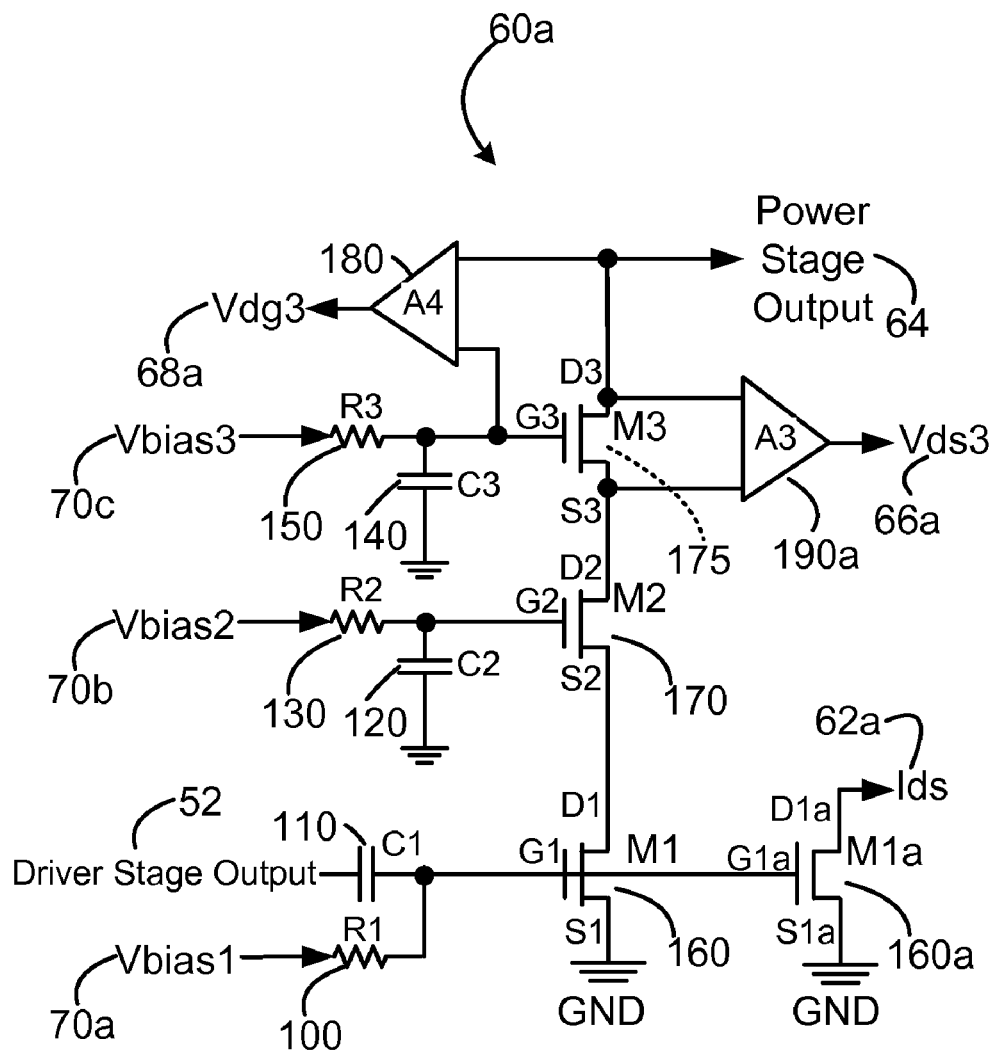
FIG. 4 is a detailed schematic of the power stage shown in FIG. 3 comprising three transistors coupled in a cascode configuration in accordance with the second exemplary embodiment.
Figure 4:
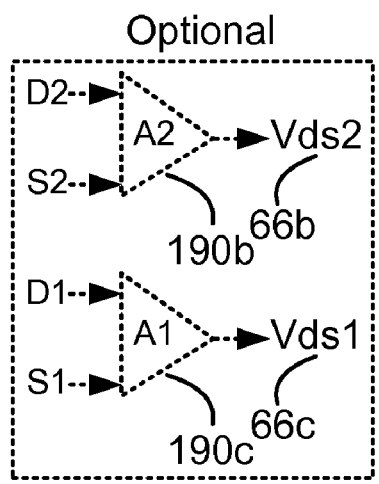

FIG. 4 is a detailed schematic of the power stage 60a shown in FIG. 3 comprising three transistors 175, 170, 160 coupled in a cascode configuration in accordance with the second exemplary embodiment.

Transistors 175, 170 and 160 are coupled in a cascode configuration. The drain of transistor 175 is coupled to power stage output 64. The source of transistor 175 is coupled to the drain of transistor 170. The source of transistor 170 is coupled to the drain of transistor 160. The source of transistor 160 is coupled to ground.

The gates of each transistor 160, 160a, 170, 175 are coupled to a resistive-capacitive network. The gates of transistors 160 and 160a are coupled to a second terminal of capacitor 110 and a second terminal of resistor 100. Driver stage output 52 is coupled to a first terminal of capacitor 110. Bias voltage Vbias1 is coupled to a first terminal of resistor 100. Bias voltage Vbias2 is coupled to a first terminal of resistor 130. A second terminal of resistor 130 is coupled to the gate of transistor 170 and a first terminal of capacitor 120. A second terminal of capacitor 120 is coupled to ground. Bias voltage Vbias3 is coupled to a first terminal of resistor 150. A second terminal of resistor 150 is coupled to the gate terminal of transistor 175 and a first terminal of capacitor 140. A second terminal of capacitor 140 is coupled to ground.

Operational amplifier 180 measures the drain to gate voltage of transistor 175. The drain of transistor 175 and the power stage output 64 are coupled to a first input to operational amplifier 180. The gate of transistor 175 is coupled to a second input to operational amplifier 180. The output terminal of operational amplifier 180 provides drain to gate voltage 68a. It is noted herein that operational amplifier 180 shown in FIG. 4 may also be implemented utilizing a differential detector or a pair of single ended detectors coupled to an operational amplifier.

Operational amplifier 190a measures the drain to source voltage of transistor 175. The drain of transistor 175 is coupled to a first input terminal of operational amplifier 190a. The source of transistor 175 is coupled to a second input terminal of operational amplifier 190a. The output of operational amplifier 190a provides drain to source voltage 66a. It is noted herein that operational amplifier 190a shown in FIG. 4 may also be implemented utilizing a differential detector or a pair of single ended detectors coupled to an operational amplifier.

Operational amplifier 190b may be used to measure the drain to source voltage of transistor 170. The drain of transistor 170 is coupled to a first input terminal of operational amplifier 190b. The source of transistor 170 is coupled to a second input terminal of operational amplifier 190b. The output of operational amplifier 190b provides drain to source voltage 66b. It is noted herein that operational amplifier 190b shown in FIG. 4 may also be implemented utilizing a differential detector or a pair of single ended detectors coupled to an operational amplifier.

Operational amplifier 190c may be used to measure the drain to source voltage of transistor 160. The drain of transistor 160 is coupled to a first input terminal of operational amplifier 190c. The source of transistor 160 is coupled to a second input terminal of operational amplifier 190c. The output of operational amplifier 190c provides drain to source voltage 66c. It is noted herein that operational amplifier 190c shown in FIG. 4 may also be implemented utilizing a differential detector or a pair of single ended detectors coupled to an operational amplifier.

It is noted that the combination of transistor terminal voltage measurements described above may be adjusted for various operating requirements. One skilled in the art would understand from the description above the benefits of utilizing this transistor terminal voltage-monitoring scheme.

Figure 5:
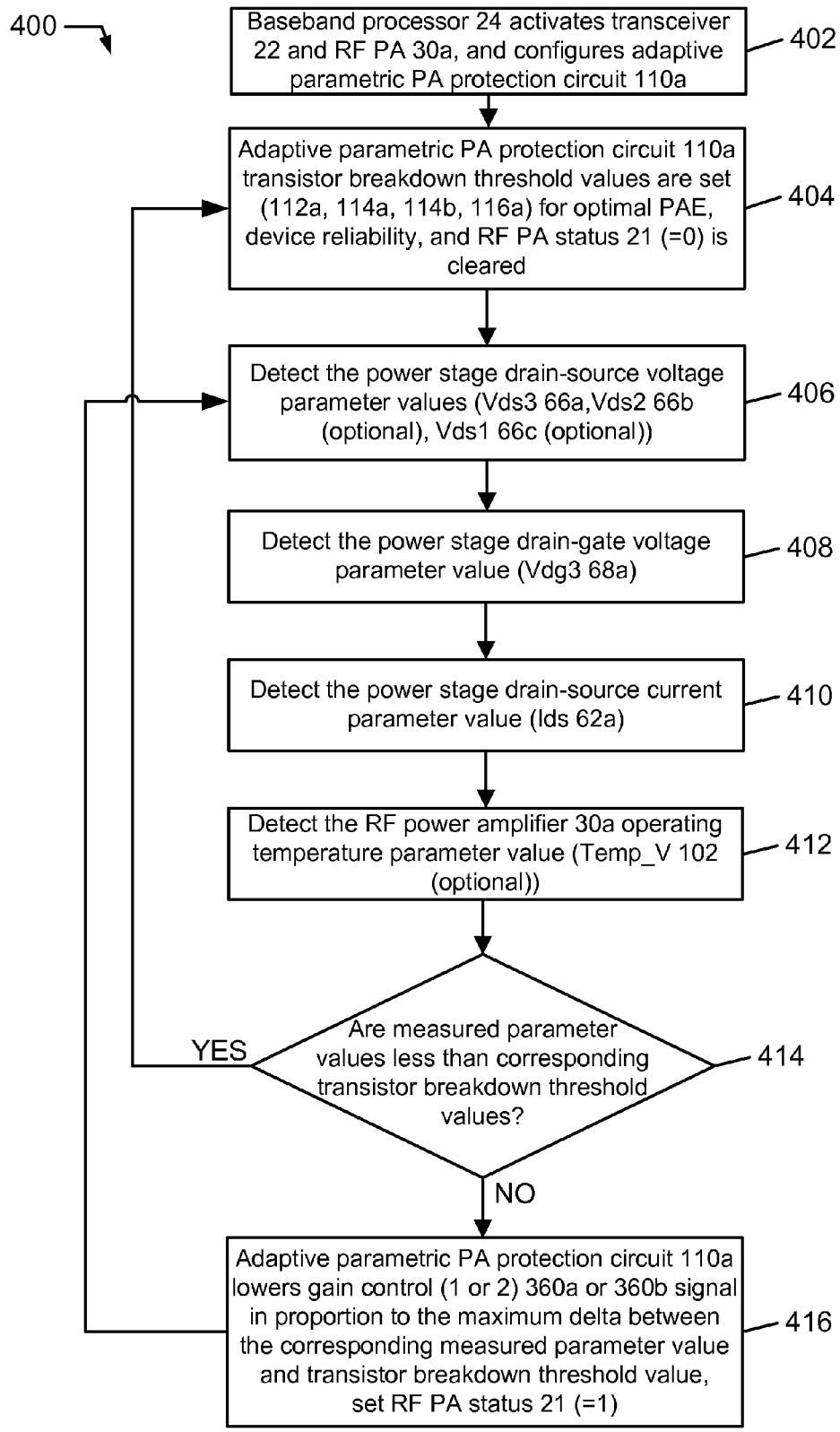
FIG. 5 is a flow chart showing the operational flow of the transceiver logic circuit which is executed by the power amplifier protection circuit shown in FIG. 3.

FIG. 5 is a flow chart showing the operational flow of the transceiver logic circuit, which is executed by the power amplifier protection circuit 110a shown in FIG. 3. In step 402, the baseband processor 24 activates transceiver 22 and RF PA 30a then configures PA protection circuit 110a. In step 404, PA protection circuit 110a transistor breakdown voltage values are set (112a, 114a, 114b, 116a) for optimal PAE, device reliability, and RF PA status 21 (=0) is cleared. In step 406, PA protection circuit 110a detects the power stage drain to source voltage parameter values (Vds3 66a, Vds2 66b (optional), Vds1 66c (optional). In step 408, PA protection circuit 110a detects the power state drain to gate voltage parameter value $V_{dg3}$ 68a. In step 410, PA protection circuit 110a detects the power stage drain to source current parameter value $I_{ds}$ 62a. In step 412, PA protection circuit detects the RF power amplifier 30a operating temperature parameter value Temp_V 102a. In step 414, PA protection circuit 110a determines whether the measured parameter values are less than corresponding transistor breakdown threshold values. If the measured parameter values are less than the corresponding transistor breakdown threshold voltages then go back to step 404. If the measured parameter values are not less than the corresponding transistor breakdown threshold voltages then go to step 416. In step 416, PA protection circuit 110a lowers gain control (1 or 2) 360a or 360b signal in proportion to the maximum delta between the corresponding measured parameter value and transistor breakdown threshold value and set RF PA status 21 (=1).

The exemplary embodiments of an adaptive parametric power amplifier circuit described above may be utilized to provide high efficiency while preventing the power stage from exceeding CMOS transistor breakdown voltages. Resulting in increased integration, thus reducing device size and cost while still satisfying the performance requirements for various communication technologies.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A device including a power stage configured for driving a radio frequency (RF) power amplifier (PA), comprising:
   a gain control element; and
   an adaptive parametric PA protection circuit configured to receive at least two inputs comprised of at least one power stage drain-source voltage parameter value, at least one power stage drain-gate voltage parameter value, and at least one power stage drain-source current parameter value, and including:
      a first section for processing the received at least two inputs, and
      a second section for generating a gain correction signal to adjust the gain control element to a desired power added efficiency (PAE) without reaching the transistor breakdown threshold values of the adaptive parametric protection circuit which are variably set as a function of operating temperature, operating frequency and operating mode.

2. The device of claim 1, wherein the power stage drain-source current parameter value is coupled to the adaptive parametric PA protection circuit through at least one current mirror connected to the power stage.

3. The device of claim 1, wherein the RF PA is implemented with RF complimentary metal-oxide silicon (RF-CMOS) transistors in an integrated circuit (IC).

4. The device of claim 1, wherein the power stage comprises multiple RF-CMOS transistors stacked to divide the power stage drain-source voltage parameter values across multiple RF-CMOS transistors in the power stage and operate the power stage within a multiple of the corresponding CMOS transistor breakdown threshold value.

5. The device of claim 1, wherein the power stage comprises multiple RF-CMOS transistors in parallel to divide the power stage drain-source current parameter value across multiple RF-CMOS transistors in the power stage and operate the power stage within a multiple of the corresponding CMOS transistor breakdown threshold value.

6. The device of claim 1, wherein the adaptive parametric PA protection circuit adjusts the gain correction signal to limit RF voltage swing across the power stage drain-source and the power stage drain-gate within the corresponding CMOS transistor breakdown threshold values.

7. The device of claim 1, wherein the adaptive parametric PA protection circuit is implemented as an analog control loop.

8. The device of claim 1, wherein the adaptive parametric PA protection circuit is embedded with the power stage in a common RF PA integrated circuit (IC).

9. The device of claim 1, wherein the device is a wireless communication device incorporating a baseband processor with RF PA control signals, the RF PA control signals altering at least one of the transistor breakdown threshold values for the operation of the adaptive parametric PA protection circuit.

10. The device of claim 1, wherein the adaptive parametric PA protection circuit includes digital to analog converters for converting the RF PA control signals into at least one analog transistor breakdown threshold value for the operation of the adaptive parametric PA protection circuit.

11. The device of claim 1, wherein the adaptive parametric PA protection circuit includes analog to digital converters for measuring at least one power stage drain-source voltage parameter value, at least one power stage drain-gate voltage parameter value, and at least one power stage bias current parameter value as digital inputs to a digital adaptive parametric PA protection circuit.

12. The device of claim 11, wherein the digital adaptive parametric PA protection circuit is implemented as a hardware state machine embedded within an RF PA IC which includes the RF PA.

13. The device of claim 11, wherein the digital adaptive parametric PA protection circuit is part of a baseband processor.

14. The device of claim 11, wherein the digital adaptive parametric PA protection circuit is implemented as a hardware state machine under the control of a baseband processor.

15. The device of claim 11, wherein the digital adaptive parametric PA protection circuit is implemented in software executed under the control of a baseband processor.

16. The device of claim 1, wherein the gain control element includes at least one driver stage prior to the power stage of the RF PA.

17. The device of claim 1, wherein the gain control element includes at least one variable RF attenuator prior to the power stage of the RF PA.

18. The device of claim 1, wherein the gain control element includes at least one variable gain RF mixer.

19. The device of claim 1, wherein the gain control element includes at least one variable analog baseband amplifier.

20. The device of claim 1, wherein the gain control element includes at least one variable analog baseband attenuator.

21. The device of claim 1, wherein the gain control element includes at least one variable digital baseband multiplier.

22. The device of claim 1, wherein the gain control element includes at least one variable digital baseband divider.

23. The device of claim 1, wherein the gain control element includes at least one variable bias signal for gain adjustment of at least one other transmit circuit element prior to the RF PA.

24. A computer program product including a computer-readable medium comprising code for causing a computer to:
    obtain at least two inputs comprised of at least one power stage drain-source voltage parameter value, at least one power stage drain-gate voltage parameter value, and at least one power stage drain-source current parameter value from a power stage of a radio frequency power amplifier (RF PA) within a wireless communication device transmitting at a RF power level;
    compare the at least two inputs to set transistor breakdown threshold values at an adaptive parametric PA protection circuit;
    assert a RF PA status signal when the compared inputs are greater than the transistor breakdown threshold values; and
    reduce the wireless communication device transmit power level in response to the asserted RF PA status signal until compared values are less than the transistor breakdown threshold values so as to maintain desired power stage PAE, which transistor breakdown threshold values are variably set as a function of operating temperature, operating frequency and operating mode.

25. A wireless communication device comprising:
    means for obtaining at least two inputs comprised of at least one power stage drain-source voltage parameter value, at least one power stage drain-gate voltage parameter value, and at least one power stage drain-source current parameter value from a power stage of a radio frequency power amplifier (RF PA) transmitting at a RF power level;
    means for comparing the at least two inputs to set transistor breakdown threshold values at an adaptive parametric PA protection circuit;
    means for asserting a RF PA status signal when compared inputs are greater than the corresponding transistor breakdown threshold values; and
    means for reducing the RF power level in response to the asserted RF PA status signal until compared values are less than the transistor breakdown threshold values so as to maintain desired power stage PAE, which transistor breakdown threshold values are variably set as a function of operating temperature, operating frequency and operating mode.

26. The device of claim 25, further comprising means for adaptive parametric PA protection via baseband processor control.

27. The device of claim 25, further comprising means for adaptive parametric PA protection via hardware state-machine control.

28. A method within a wireless communication device comprising:
    obtaining at least two inputs comprised of at least one power stage drain-source voltage parameter value, at least one power stage drain-gate voltage parameter value, and at least one power stage drain-source current parameter value from a power stage of a radio frequency power amplifier (RF PA) transmitting at a RF power level;
    comparing the at least two inputs to set transistor breakdown threshold values at an adaptive parametric PA protection circuit;
    asserting a RF PA status signal when compared inputs are greater than the corresponding transistor breakdown threshold values; and
    reducing the RF power level in response to the asserted RF PA status signal until compared values are less than the transistor breakdown threshold values so as to maintain desired power stage PAE, which transistor breakdown threshold values are variably set as a function of operating temperature, operating frequency and operating mode.

29. The method of claim 28, further comprising adaptive parametric PA protection via baseband processor control.

30. The method of claim 28, further comprising adaptive parametric PA protection via hardware state machine control.

* * * * *